(12) United States Patent
Haymore et al.

(10) Patent No.: US 11,008,651 B2
(45) Date of Patent: May 18, 2021

(54) DC MAGNETRON SPUTTERING

(71) Applicant: SPTS TECHNOLOGIES LIMITED, Newport (GB)

(72) Inventors: Scott Haymore, Newport (GB); Amit Rastogi, Newport (GB); Rhonda Hyndman, Newport (GB); Steve Burgess, Newport (GB); Ian Moncrieff, Wotton-under-Edge (GB); Chris Kendal, Newport (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 0 days.

(21) Appl. No.: 15/478,283

(22) Filed: Apr. 4, 2017

(65) Prior Publication Data

US 2017/0294294 A1  Oct. 12, 2017

(30) Foreign Application Priority Data

Apr. 11, 2016 (GB) ...................................... 1606115

(51) Int. Cl.
*C23C 14/06* (2006.01)
*C23C 14/34* (2006.01)
(Continued)

(52) U.S. Cl.
CPC ............ *C23C 14/50* (2013.01); *C23C 14/345* (2013.01); *C23C 14/3407* (2013.01); *C23C 14/3485* (2013.01); *C23C 14/35* (2013.01); *C23C 14/505* (2013.01); *C23C 14/541* (2013.01); *H01J 37/32715* (2013.01); *H01J 37/3405* (2013.01);
(Continued)

(58) Field of Classification Search
CPC ....... C23C 14/50; C23C 14/505; C23C 14/35; C23C 14/345; C23C 14/3407; C23C 14/0641; C23C 14/0617; C23C 16/4583; C23C 14/541; H01J 37/32715; H01J 37/34; H01J 37/3426; H01J 37/32706; H01J 37/3405; H01J 37/3467; H01J 37/3411
See application file for complete search history.

(56) References Cited

U.S. PATENT DOCUMENTS 5,554,266 A     9/1996  Okamoto
5,695,566 A  *  12/1997 Suzuki ................... C23C 14/50
                                                  118/723 E
(Continued)

FOREIGN PATENT DOCUMENTS

CN       105027274 A       11/2015
JP         S619571 A        1/1986
JP        02011761 A  *     1/1990

OTHER PUBLICATIONS

JPO, Notice of grounds of Rejection for JP 2017076123, dated Mar. 2, 2021.

*Primary Examiner* — Michael A Band
(74) *Attorney, Agent, or Firm* — Hodgson Russ LLP

(57) ABSTRACT

A DC magnetron sputtering apparatus is for depositing a film on a substrate. The apparatus includes a chamber, a substrate support positioned within the chamber, a DC magnetron, and an electrical signal supply device for supplying an electrical bias signal that, in use, causes ions to bombard a substrate positioned on the substrate support. The substrate support includes a central region surrounded by an edge region, the central region being raised with respect to the edge region.

9 Claims, 8 Drawing Sheets

(51) Int. Cl.
   *C23C 14/35*   (2006.01)
   *C23C 14/50*   (2006.01)
   *C23C 14/54*   (2006.01)
   *H01J 37/32*   (2006.01)
   *H01J 37/34*   (2006.01)

(52) U.S. Cl.
   CPC ....... *H01J 37/3411* (2013.01); *H01J 37/3467* (2013.01); *C23C 14/0617* (2013.01); *C23C 14/0641* (2013.01); *H01J 37/3426* (2013.01)

(56) References Cited

U.S. PATENT DOCUMENTS

| | | | |
|---|---|---|---|
| 6,506,291 B2 * | 1/2003 | Tsai ........................ | C23C 14/50 118/724 |
| 6,524,971 B1 | 2/2003 | Fetter et al. | |
| 6,682,603 B2 * | 1/2004 | Gondhalekar .... | C23C 16/45563 118/723 E |
| 6,808,607 B2 * | 10/2004 | Christie ................. | H01J 37/34 204/192.12 |
| 7,358,554 B2 | 4/2008 | Basceri | |
| 8,062,487 B2 * | 11/2011 | Cheng ............... | H01J 37/32642 204/298.15 |
| 8,808,513 B2 | 8/2014 | Laptev et al. | |
| 2003/0211757 A1 | 11/2003 | Gondhalekar et al. | |
| 2004/0060812 A1 | 4/2004 | Chen et al. | |
| 2014/0268479 A1 * | 9/2014 | West ................. | H01L 21/67109 361/234 |
| 2015/0311046 A1 | 10/2015 | Yeh et al. | |
| 2015/0345015 A1 * | 12/2015 | Chiba ................. | C23C 16/4412 118/730 |

* cited by examiner

DC MAGNETRON SPUTTERING

BACKGROUND

This invention relates to a DC magnetron sputtering apparatus for depositing a film on a substrate. The invention relates also to an associated method of depositing a film on a substrate.

Many MEMS (micro electro mechanical systems) devices now utilise piezoelectric materials such as aluminium nitride (AlN) and bimetallic nitrides such as aluminium scandium nitride (AlScN) as components in device control. In many devices, the stress state of the deposited piezoelectric thin film has a direct influence on the properties and usefulness of the device. Devices such as membranes and cantilevers are examples of devices where the stress state of the deposited piezoelectric thin film is extremely important. Some devices are suited to films having a moderately compressive stress whilst other devices are suited to films having a moderately tensile stress. Many devices require that there is only a small variation in the stress, whether it is compressive or tensile in nature.

Highly oriented (002) aluminium nitride grains are critical for the proper function of many MEMS devices. To achieve good grain texture, it is important to use a high vacuum deposition environment and high wafer temperatures. High target powers (greater than 5 kW for a 200 mm wafer) result in elevated temperatures due to the exothermic enthalpy of condensation of aluminium nitride. Ideally, the stress state of the deposited film would be entirely uniform across a wafer with a value close to zero. This would give rise to uniform device properties suitable for high yield device manufacture. However, this ideal state is not achieved due to variations in factors such as film thickness, ion bombardment and temperature. In general, relatively high wafer temperatures of 400° C. or more are necessary to form aluminium nitride crystals with good texture, but these high temperatures cause the film to form in a tensile state. Aluminium nitride deposition that is purely thermal in nature has a relatively uniform stress distribution across the deposited film. However, the film is deposited in a highly tensile stress state. This uniformity is due to a highly uniform wafer temperature during deposition which is in turn achieved due to the gentle, uniform condensation of plasma species onto the wafer surface during deposition. However cracking of the film caused by contraction as the wafer cools and relaxes is a significant problem. The stress collapses at the centre of the wafer due to the cracking of the film. FIG. 1 shows stress values of a thermally deposited aluminium nitride film as a function of radial position across the wafer. It can be seen that the overall stress state of the film is highly tensile. It can also be seen that there is a variation of about 100 MPa in the stress values across the film.

If an aluminium nitride film is deposited by DC magnetron sputtering with an RF power applied to the wafer to induce a DC bias, then different stress characteristics are observed in the deposited film. FIG. 2 shows stress as a function of radial position for an aluminium nitride film deposited using DC magnetron sputtering with an applied RF power to induce DC bias. It can be seen that the average stress value is substantially reduced in comparison to FIG. 1. In the stress profile shown in FIG. 2, the average stress is around 50 MPa and the maximum stress value is around 250 MPa. The stress profile in FIG. 2 is significantly less uniform than the stress profile of FIG. 1, with a variation of nearly 500 MPa being observed in FIG. 2. Therefore, the variation in stress across the wafer is nearly 10 times the average stress of the film. These results can be easily explained. The applied RF power induces a DC bias and an associated electric field at the wafer surface. This increases ion bombardment from the plasma onto the wafer surface. The ion bombardment compacts the deposited film to produce a more compressive stress state. Aluminium nitride films having lower tensile stresses can be desirable for use in many MEMs devices. For many applications a stress value in the range −50 to +50 MPa is desirable, but the high degree of stress non-uniformity across the film is undesirable. The stress non-uniformity is due to the typical design of a magnetron in the sputtering system, which is configured to achieve a uniform deposition thickness on the wafer. This leads to more erosion of the target at the target edge than in the centre of the target. This in turn leads to "minor" erosion zones associated with the centre of the target and "major" erosion zones associated with the edge of the target. Whilst this configuration is ideal for maintaining uniform film thickness, the present inventors have realised that it poses a problem when using applied RF power to control average stress. The position of the major erosion zones at the edge of the target results in a far greater degree of ionisation at the edge of the target compared to the centre. The electric field at the wafer surface then generates a far greater amount of ion bombardment at the edge compared to the centre and this gives rise to a more tensile centre and a more compressive edge of the film. For a given target size, an increasing wafer size will result in a larger difference between the stress at the centre and at the edge of the wafer due to the large influence of the major erosion zones.

SUMMARY

It would be highly desirable to provide a way of depositing aluminium nitride films which are not strongly tensile in nature, but have a reduced variation in stress across the wafer in comparison to prior art methods using magnetron sputtering with a DC bias, such as the method used to produce the results shown in FIG. 2.

The present invention, in at least some of its embodiments, addresses these problems and needs. Whilst the invention is particularly applicable to the deposition of aluminium nitride films, it is also applicable to the deposition of other materials.

According to a first aspect of the invention there is provided a DC magnetron sputtering apparatus for depositing a film on a substrate comprising:

a chamber;

a substrate support positioned within the chamber;

a DC magnetron; and an electrical signal supply device for supplying an electrical bias signal that, in use, causes ions to bombard a substrate positioned on the substrate support;

in which the substrate support comprises a central region surrounded by an edge region, the central region being raised with respect to the edge region.

In use, a planar substrate may be positioned on the central region of the substrate support so that a portion of the substrate overlays the edge region. The portion of the substrate overlaying the edge region is then spaced apart from the edge region. Surprisingly, it has been found that this arrangement can provide a substantial improvement in stress uniformity across the deposited film. A further advantage is that the average stress of the deposited film can be relatively low. This makes the deposited film suitable for a number of useful applications, such as in MEMs.

The substrate support may comprise a step leading from the edge region to the central region. The step may have a height in the range 0.1 to 1.0 mm. Preferably, the step has height in the range 0.2 to 0.5 mm.

The central region may define a substantially planar plateau region.

The electrical signal supply device may supply an RF bias signal.

The electrical bias signal may cause a DC bias to be induced which causes ions to bombard the substrate.

Typically, the electrical bias signal is supplied to the substrate support.

The DC magnetron may be a pulsed DC magnetron. Alternatively, the DC magnetron may be a non-pulsed DC magnetron.

Generally, the DC magnetron comprises a target. The target is made from a suitable material which may be sputtered from the target as part of the film forming process.

The DC magnetron may be a balanced magnetron or an unbalanced magnetron.

The apparatus may comprise a rotation device for rotating the substrate during film deposition. The rotation device may form part of the substrate support. The rotation device may be a puck located in the substrate support.

The substrate support may be a platen.

The substrate support of the invention comprising the central region and the edge region can be manufactured conveniently in a number of ways. A milling process may be used to manufacture the substrate support. This is particularly convenient when the substrate support comprises a step between the edge region and the central region.

According to a second aspect of the invention there is provided a method of depositing a film on substrate comprising the steps of:

positioning the substrate on a substrate support in a chamber; and depositing the film from the substrate using a DC magnetron sputtering process in which an electrical bias signal causes ions to bombard the substrate;

in which: the substrate support comprises a central region surrounded by an edge region, the central region being raised with respect to the edge region, and the substrate is positioned on the central region so that a portion of the substrate overlays the edge region and is spaced apart therefrom.

The film may be a metal nitride film. The film may be an aluminium nitride film. The film may be a [002] oriented aluminium nitride film.

The film may be a bimetallic nitride film such as an AlScN film.

However, in principle the film can be any film that may be deposited by DC magnetron sputtering. The invention is particularly suited to deposition of films where tolerances are strict and a tight control over stress uniformity is required. The film may be deposited by reactive sputtering.

The electrical bias signal may produce a DC bias.

The electrical bias signal may be an RF bias signal.

Typically, the substrate extends beyond the edge region. Generally, the substrate support has an associated diameter and the substrate has an associated diameter. In these embodiments, the diameter of the substrate is typically greater then the diameter of the substrate support.

The substrate may be rotated during the deposition of the film. It has been found that this can give rise to further improvements in the uniformity of film stress across the film.

The film may be a thin film. After deposition has been completed, the film may have a thickness of 100 microns or less. However, the invention can be used to deposit films of any desired thickness.

The DC magnetron sputtering process may be performed with a chamber pressure in the range 1 to 20 mTorr.

During the DC magnetron sputtering process, the substrate support may be at a temperature in the range 100 to 400° C.

The electrical bias signal may have a voltage in the range −20 to 50 V.

Typically, the substrate is a planar substrate, such as a wafer.

The substrate may be a semiconductor substrate, such as a semiconductor wafer. The substrate may be a silicon substrate.

Whilst the invention is described above, it extends to any inventive combination of the features set out above or in the following description, drawings or claims. For example, any feature described in relation to the first aspect of the invention is also disclosed in combination with the second aspect of the invention and visa versa.

BRIEF DESCRIPTION OF THE DRAWINGS

Embodiments of apparatus and methods in accordance with the invention will now be described with reference to the accompanying drawings, in which.

DETAILED DESCRIPTION OF EMBODIMENTS

Figure 1:
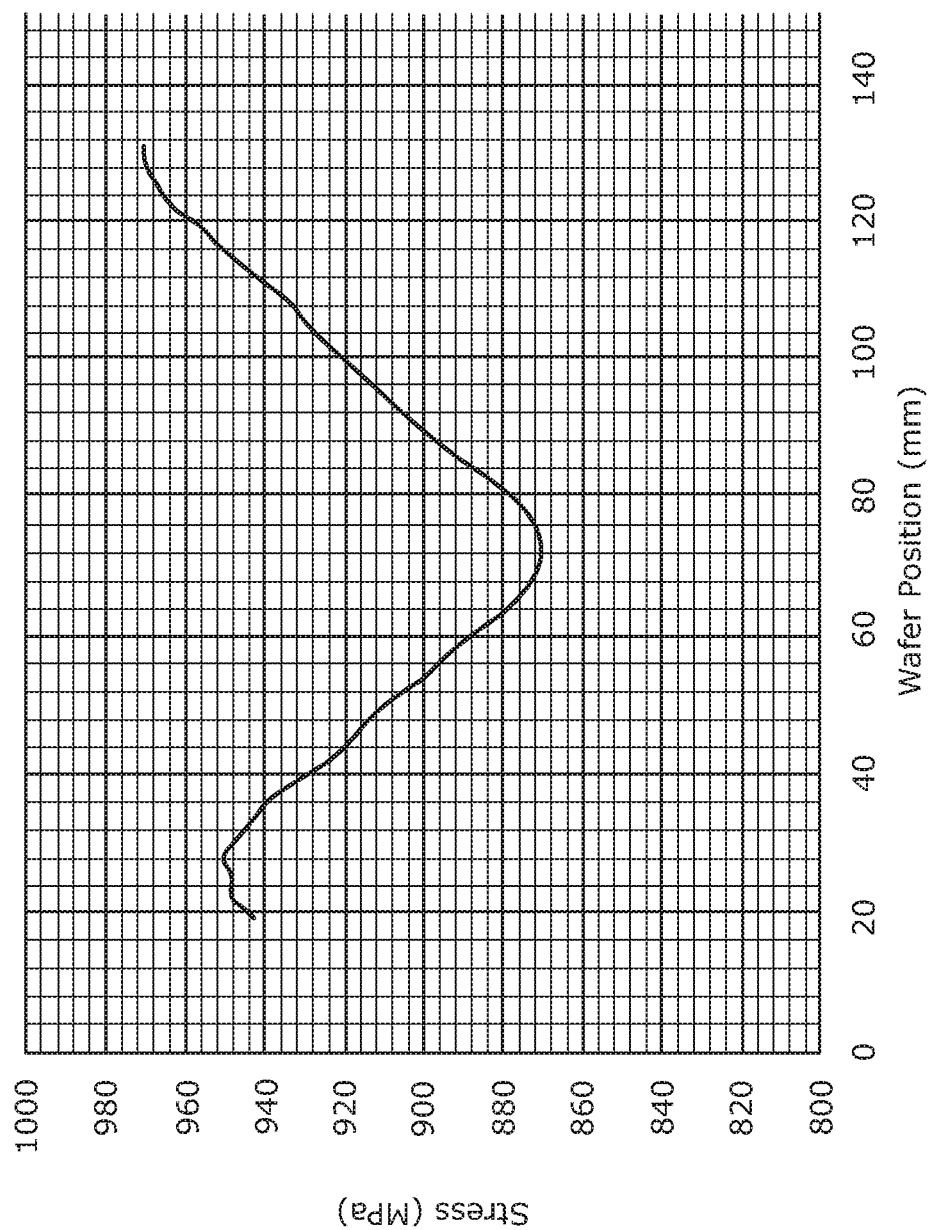
FIG. 1 shows AlN film stress as a function of wafer radial position for a thermal magnetron deposition process.
Figure 2:
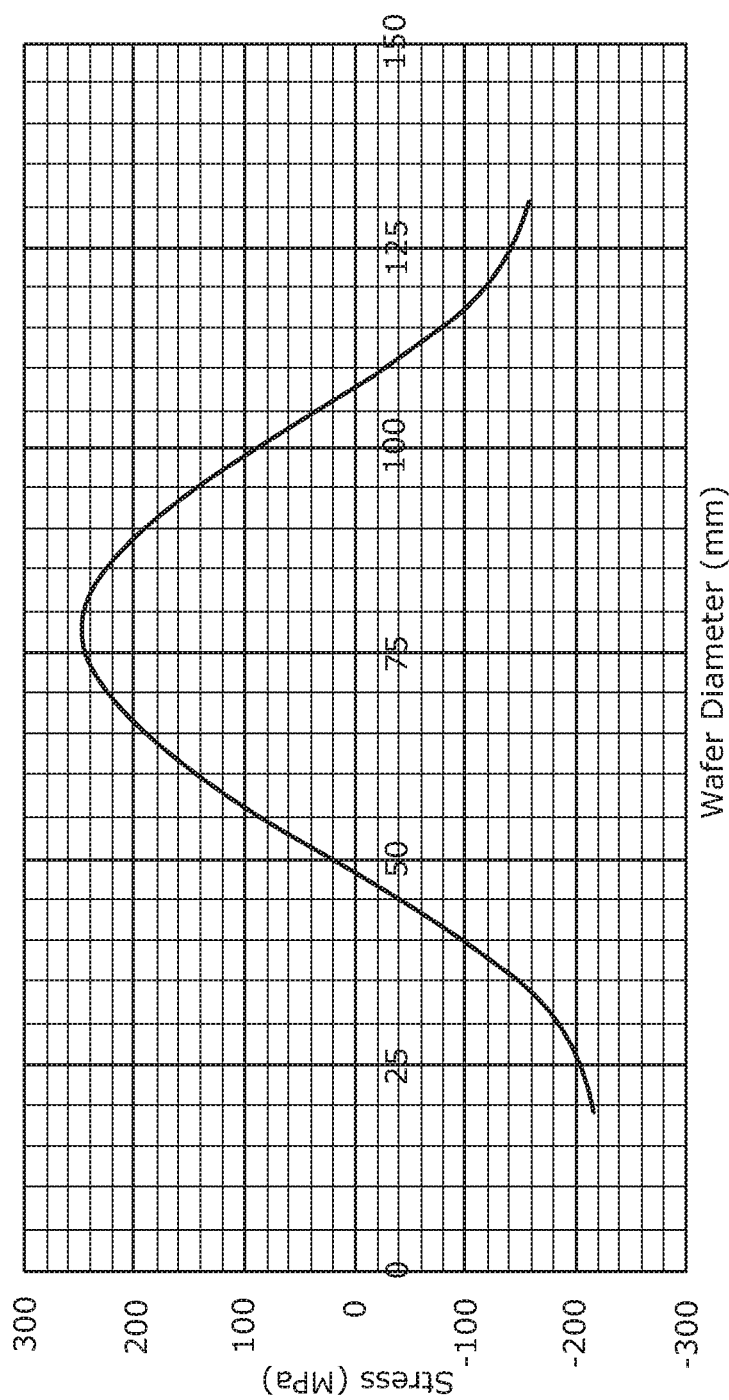
FIG. 2 shows AlN film stress as a function of wafer radial position for a magnetron deposition process in which RF power is applied to the wafer.
Figure 3:
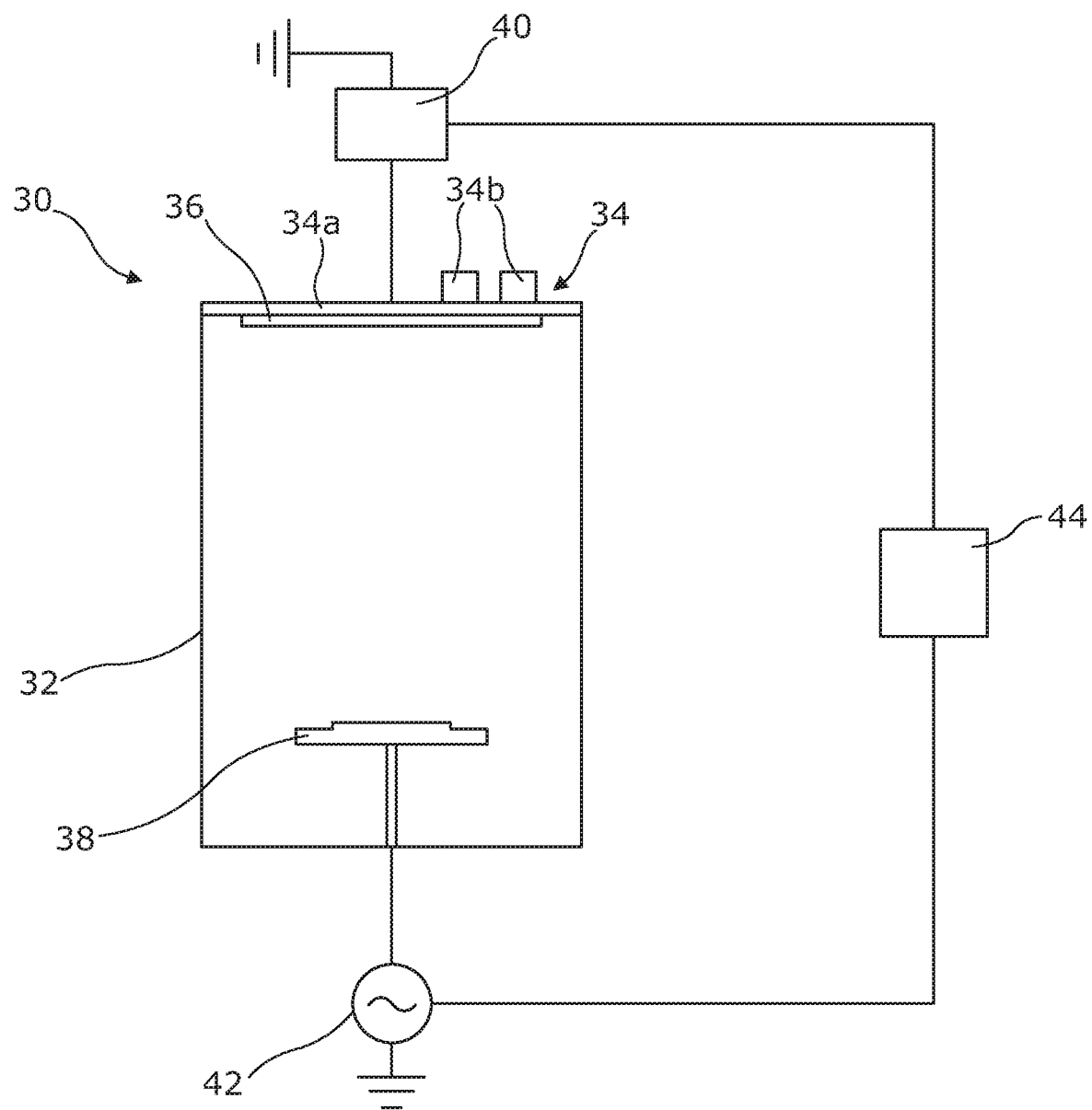
FIG. 3 shows an apparatus of the invention.

FIG. 3 shows an apparatus of the invention, depicted generally at 30. The apparatus 30 comprises a chamber 32 which contains a DC magnetron device 34, a target 36 from which material is sputtered by the magnetron device 34 and a substrate support 38 which supports a substrate (not shown) on which a desired material is deposited. In the embodiment shown in FIG. 3, the chamber is cylindrical, although in principle other chamber shapes might be utilised. For presentational simplicity, other common aspects of magnetron sputtering devices, such as gas inlets and outlets, are not shown in FIG. 3.

The DC magnetron device 34 comprises a target backing plate 34a which acts as a lid of the chamber 32. A target 36 is bonded to the target backing plate 34a. Rotatable magnets 34b are positioned close to and opposite the face of the target backing plate 34a and the target 36. Pulsed DC power is applied to the target 36 from a DC power supply 40. RF power is applied to the substrate support 38 from a RF power supply 42 in order to provide a DC electrical bias to the substrate support. Typically, the substrate support 38 is driven at 13.56 MHz out of convention, although the invention is not limited in this regard. The operation of the power supplies 40 42 is controlled with a controller 44. The controller 44 may be a computer having a suitable graphical user interface.

In use, a wafer is positioned on the substrate support 38 which is driven to produce a negative DC bias. A suitable gas mixture is introduced into the chamber and a pulsed, negative, high DC voltage is applied to the target backing plate 34a/target 36 which thereby acts as a cathode. This creates a high density plasma. The wafer sits inside the main erosion track of the cathode which is dictated by the rotating path of the magnets 34b. Without wishing to be limited by any particular theory or conjuncture, it is believed that there is typically a far higher degree of ionisation at the edge of the target compared to the centre, and the DC bias at the wafer generates more ion bombardment at the edge of the wafer compared to the centre. This is believed to give rise to a generally high degree of stress non uniformity across the wafer.

Figure 4:
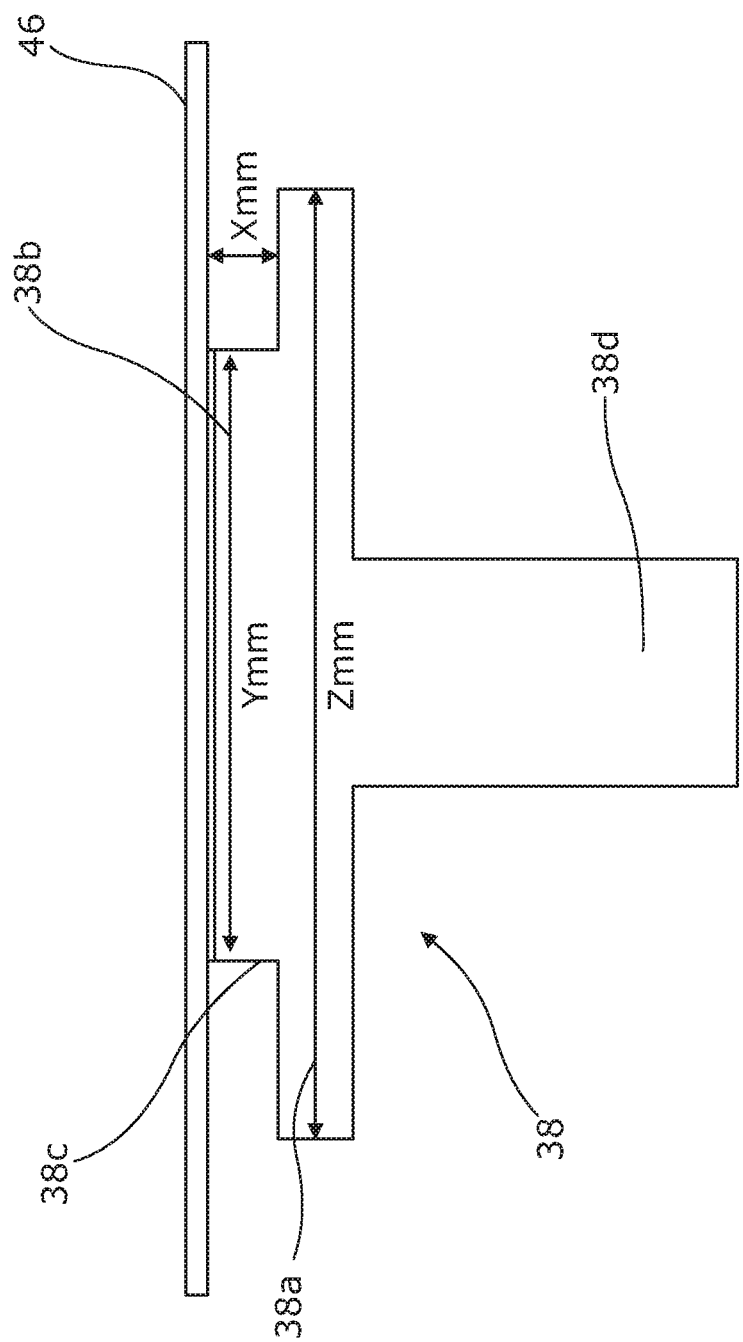
FIG. 4 is a side view of a substrate support of the invention.

FIG. 4 shows the substrate support 38 in more detail. It can be seen that the substrate support is in the form of a stepped platen having an edge region 38a which is in communication with a raised central region 38b via a step 38c. The edge region 38a and central region 38b are supported on a support structure 38d. The support structure 38d can enable the platen to be raised and lowered, as is well known in the art. FIG. 4 also shows a substrate wafer 46 positioned on the substrate support 38. The planar substrate wafer 46 lies flush with the central region 38b and is therefore raised with respect to the edge portion 38a as shown in FIG. 4. The substrate wafer 46 is sized so that it overhangs the edge region 38a and is spaced apart therefrom. Without wishing to be limited by any particular theory or conjecture, it is believed that the stepped profile of the substrate support 38 has two effects. Firstly, RF coupling is reduced at the edge of the wafer substrate, which reduces ion bombardment relative to the centre of the wafer. This makes the edge profile of the deposited film more tensile. Since the centre of the wafer is also tensile, the variation in stress across the wafer is reduced. Secondly, there is no direct contact between the substrate support and the wafer substrate at the edges of the wafer substrate, which is believed to reduce contact cooling of the wafer by the substrate support. The wafer substrate is heated throughout deposition by ion bombardment. Since the centre of the wafer is in thermal contact with the centre region 38b of the substrate support, the centre region of the wafer is cooled by the substrate support. The edges of the wafer substrate do not receive direct contact cooling and therefore experience higher temperatures. This makes the edge of the substrate more tensile which again acts to reduce the overall variation in stress across the wafer.

It will be appreciated that conventional prior art substrate supports are planar, with the wafer being in contact with the substrate support across its entire area. Table 1 provides dimensions for a conventional, planar prior art platen and two embodiments of platens of the invention, denoted as mark 1 and mark 2. In Table 1, X corresponds to the height of the step, Y corresponds to the diameter of the central region, and Z corresponds to the diameter of the edge region. These dimensions are suitable for supporting 200 mm diameter wafers. Typically, the height of the step is less than 1.0 mm, although it will be appreciated that the step height and the other dimensions of the substrate support can be varied as appropriate in order to produce the optimal combination of heating and RF conditions for a desired substrate size and with a desired average stress characteristic of the deposited film while maintaining a "dark space", i.e. no plasma, below the wafer. Experiments were performed depositing AlN films onto wafers using the mark 1 and mark 2 substrate supports. The associated process conditions are shown below in Table 2.

TABLE 1

Platen dimensions for 200 mm wafers for standard and 2 stepped variants.

|        | Standard Platen | Mark 1  | Mark 2  |
|--------|-----------------|---------|---------|
| X (mm) | 0               | 0.2-0.5 | 0.2-0.5 |
| Y (mm) | 194             | 114     | 60      |
| Z (mm) | 194             | 194     | 194     |

TABLE 2

Process parameter range for AlN depositions.

| Process Step | Parameter Range |
|---|---|
| Pulsed DC power (kW) | 1-10 |
| Pulse frequency (kHz) & duration (μsec) | 5-100, 1-10 |
| Chamber Pressure (mT) | 1-12 |
| Gas flows (sccm) | 5-40Ar/5-80N$_2$ |
| Platen temperature (° C.) | 100-400 |
| Substrate bias (Volts) | −20-45 |
| Target to wafer separation (cm) | 3-9 |

Figure 5:
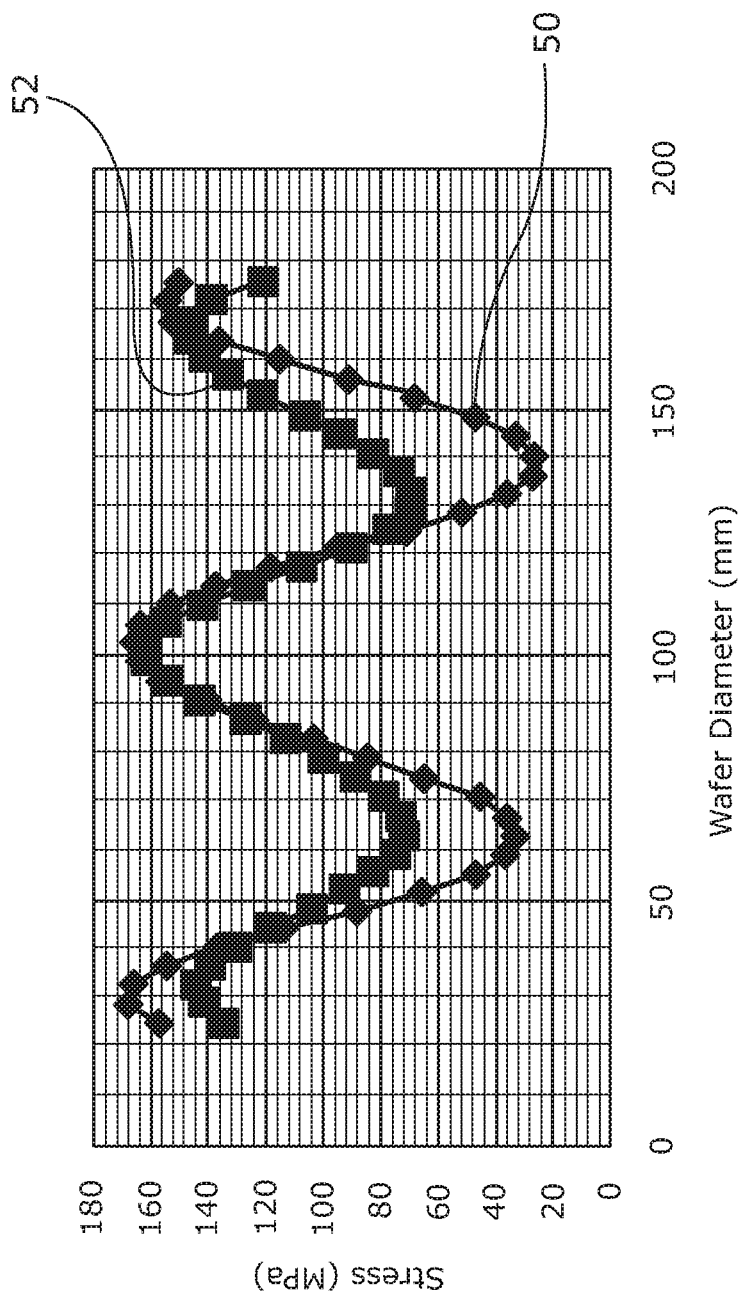
FIG. 5 shows AlN film stress as a function of wafer radial position obtained using two stepped substrate supports.

FIG. 5 shows stress profiles as a function of wafer radial position obtained using the mark 1 and mark 2 platens of the invention. The curve 50 shows the stress profile obtained using the mark 1 platen and the curve 52 shows the stress profile obtained using the mark 2 platen. It can be seen that the average stress in both instances is moderately tensile, with the mark 2 platen giving rise to a slightly more tensile average stress in the deposited AlN film. The variation in stress across the film is around 140 MPa for the mark 1 platen and around 100 MPa for the mark 2 platen. In comparison, AlN films deposited using the conventional planar platen exhibited a variation in stress across the film of about 250 MPa.

Figure 6:
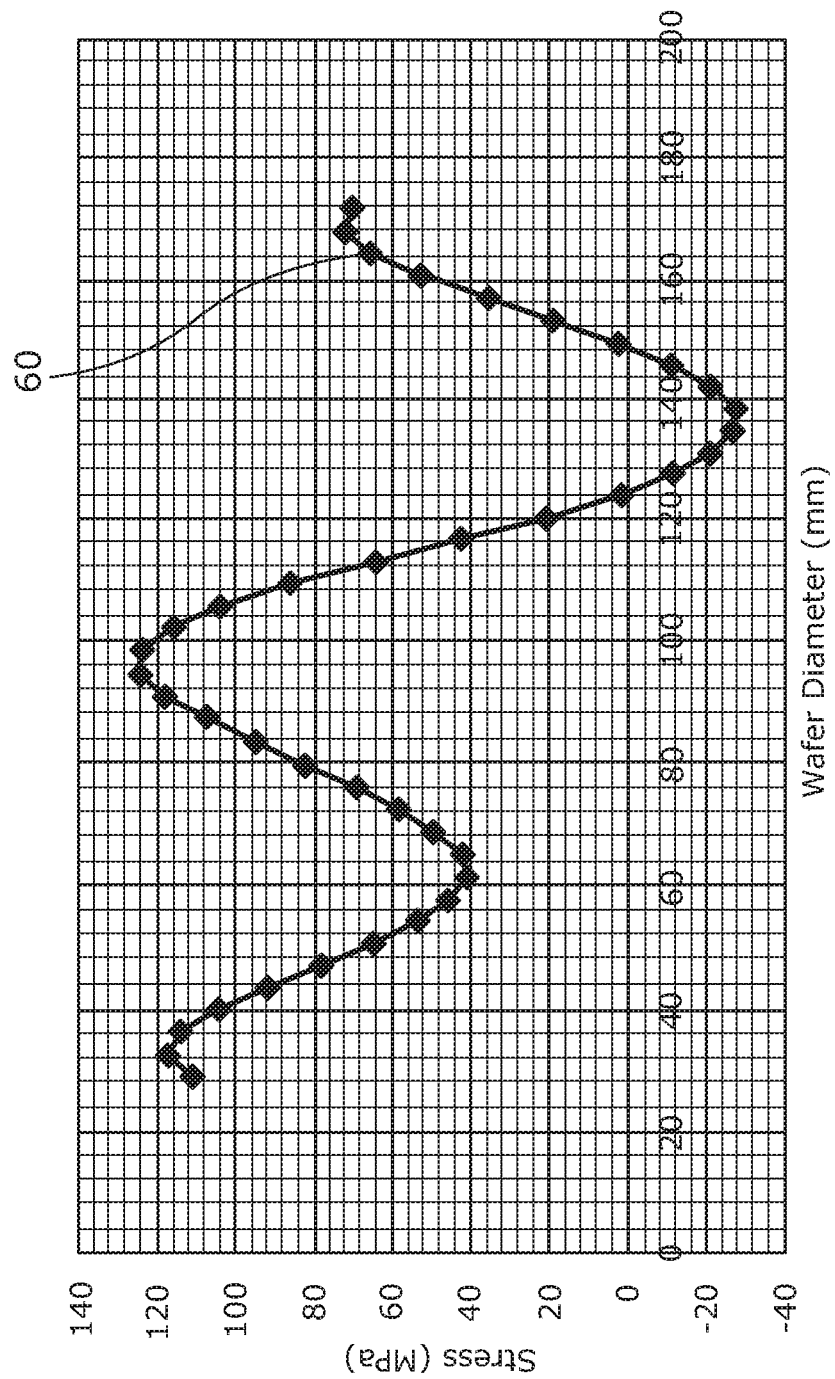
FIG. 6 shows an asymmetric AlN film stress profile as a function of wafer radial position.

It has been observed that another factor affecting stress non-uniformity in the deposited films is the presence of a non-radial component across the wafer. In some instances it has been found that there can be a large variation in stress from one half of a wafer substrate to another. FIG. 6 shows a stress profile 60 which exhibits an asymmetrical profile from one half of the wafer to the other. Without wishing to be limited by any particular theory or conjecture, it is believed that the asymmetry is likely due to small variations in plasma potential through the chamber. A change of 1-2V in potential at the wafer surface can lead to stress differences of the order of 100 MPa. In practice, it is difficult to avoid voltage variations of this order due to small asymmetries in hardware. This problem can be overcome by using substrate supports of the invention and rotating the wafer during the deposition process. The rotation can be done in various ways, although it is preferable that the wafer experiences a full 360 degree turn during the process. Whilst it is in principle possible to continuously rotate the wafer during deposition, one practical solution is to deposit the film in several steps, and to rotate the wafer in between the deposition steps. This creates an averaging effect across the wafer but improves thickness uniformity and stress uniformity.

Figure 7:
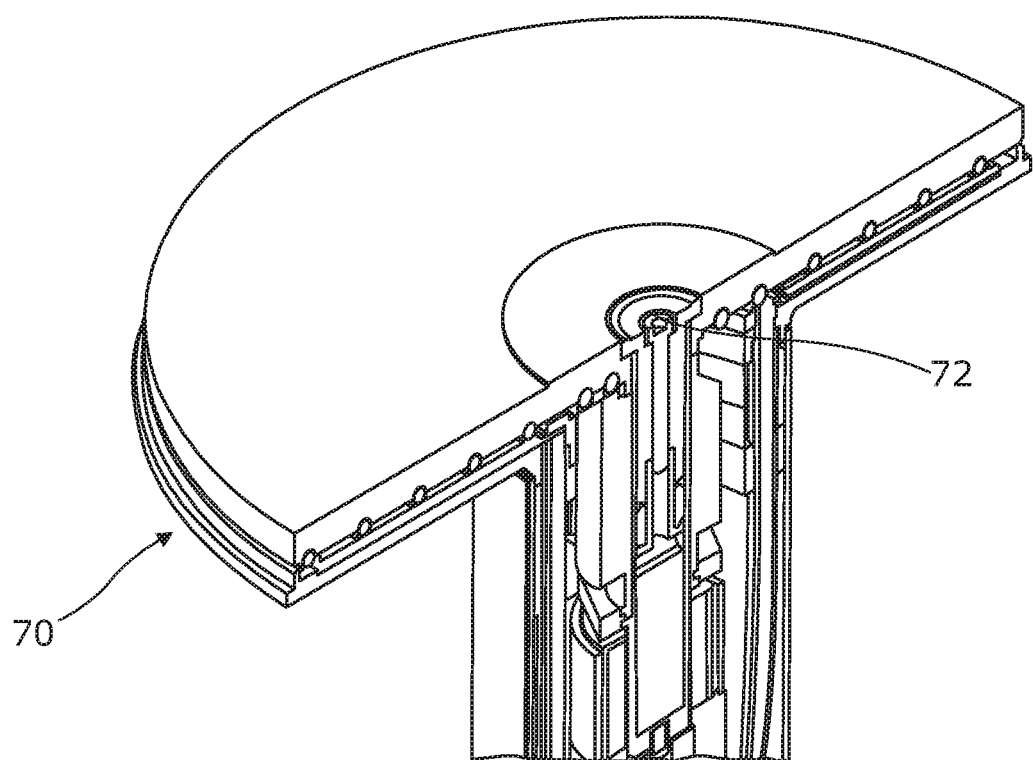
FIG. 7 is a cut away perspective view of a stepped substrate support having a substrate rotation facility.
Figure 8:
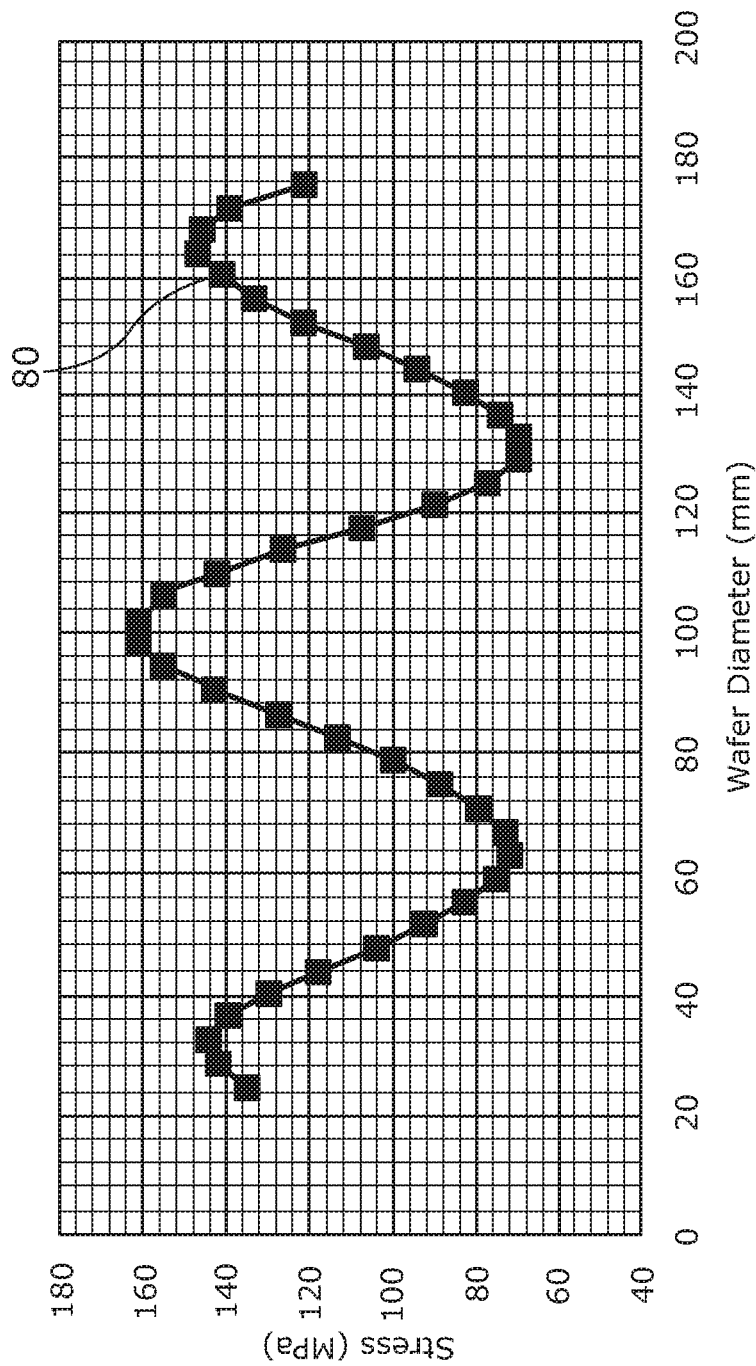
FIG. 8 shows AlN film stress as a function of wafer position for a wafer which is rotated during deposition.

FIG. 7 shows a stepped platen 70 having a puck 72 at the centre of the platen which raises and rotates the wafer between deposition steps. This is a convenient way in which the wafer can be rotated through the deposition process. FIG. 8 shows a stress profile 80 as a function of wafer radial position obtained using the substrate support shown in FIG. 7. It can be seen that an excellent, almost completely symmetric profile is attained with a relatively small variation (about 90 MPa) in stress across the wafer.

The invention can be applied to a range of films, including other metal nitrides. The invention is particularly applicable to deposition processes where the tolerances tight, especially where it is required that the stress of the deposited film is highly uniform.

What is claimed is:

1. A DC magnetron sputtering apparatus for forming a film by a deposition process, the apparatus comprising:
   a chamber defining therein a process space;
   a substrate support positioned within the chamber, wherein the substrate support is configured for a temperature range from 100° C. to 400° C.;
   a substrate positioned on an uppermost surface of the substrate support as exposed to the process space and on which the film is to be deposited;
   a DC magnetron comprising a cathode disposed within the chamber above the substrate, a DC power supply connected to the cathode and magnets adjacent to the cathode, wherein the cathode includes a backing plate and a target, wherein the target is disposed in the process space of the chamber on a first side of the backing plate and the magnets are disposed outside of the chamber on a second side of the backing plate opposite the target; and
   an electrical signal supply device for supplying an electrical bias signal that, in use, causes ions to bombard the substrate positioned on the substrate support, wherein the electrical signal supply device is an RF power source operatively connected to the substrate support and configured to provide an RF power as the electrical bias signal;
   in which the substrate support comprises a central region surrounded by an edge region, the central region having a plateau, the edge region having an upwardly facing surface, and the plateau of the central region being raised with respect to the upwardly facing surface of the edge region, wherein the substrate support comprises a step having a height in the range of 0.1 to 1.0 mm leading from the edge region to the central region, wherein a diameter of the plateau is from 60 mm to 114 mm, and wherein a ratio of the diameter of the plateau of the central region to the diameter of the edge region is from 60/194 to 114/194, and
   the substrate positioned on the substrate support has (a) a central portion that is disposed in contact with the plateau of the central region of the substrate support, and (b) an outermost peripheral portion that overlays and extends beyond the upwardly facing surface of the edge region of the substrate support, wherein there is no direct contact between the outermost peripheral portion of the substrate and the upwardly facing surface of the edge region of the substrate support such that the outermost peripheral portion of the substrate is completely spaced apart from the substrate support, and wherein a dark space is formed above the upwardly facing surface proximate the central region between the upwardly facing surface and the outermost peripheral portion of the substrate.

2. The apparatus according to claim 1 in which the plateau of the central region defines the substantially planar uppermost surface of the substrate support against which the substrate lies.

3. The apparatus according to claim 1 in which the DC magnetron is a pulsed DC magnetron.

4. The apparatus according to claim 1 comprising a rotation device for rotating the substrate during film deposition.

5. The apparatus according to claim 1 in which the height of the step is in the range of 0.2 to 0.5 mm.

6. A pulsed DC magnetron sputtering apparatus for forming a film by a deposition process, the apparatus comprising:
   a chamber defining a process space therein;
   a substrate support positioned within the chamber, wherein the substrate support is configured for a temperature range from 100° C. to 400° C.;
   a substrate positioned on an uppermost surface of the substrate support as exposed to the process space and on which the film is to be deposited;
   a pulsed DC magnetron comprising a cathode disposed within the chamber above the substrate, a DC power supply connected to the cathode and configured to supply a pulsed DC power to the cathode, and magnets adjacent to the cathode, wherein the cathode includes a backing plate and a target, wherein the target is disposed in the process space of the chamber on a first side of the backing plate and the magnets are disposed outside of the chamber on a second side of the backing plate opposite the target; and
   an electrical signal supply device for supplying an electrical bias signal that, in use, causes ions to bombard the substrate positioned on the substrate support, wherein the electrical signal supply device is an RF power source operatively connected to the substrate support and configured to provide an RF power as the electrical bias signal;
   in which the substrate support comprises a central region surrounded by an edge region, the central region having a plateau, the edge region having an upwardly facing surface, and the plateau of the central region being raised with respect to the upwardly facing surface of the edge region, wherein a diameter of the plateau is from 60 mm to 114 mm, and wherein a ratio of the diameter of the plateau of the central region to the diameter of the edge region is from 60/194 to 114/194,
   the substrate positioned on the substrate support has (a) a central portion that is disposed in contact with the plateau of the central region of the substrate support, and (b) an outermost peripheral portion that overlays and extends beyond the edge region of the substrate support, wherein there is no direct contact between the outermost peripheral portion of the substrate and the edge region of the substrate support such that the outermost peripheral portion of the substrate is completely spaced apart from the substrate support, and
   in which the substrate support comprises a step leading from the edge region to the central region, the step having a height in the range of 0.1 to 1.0 mm, and wherein a dark space is formed above the upwardly facing surface proximate the central region between the upwardly facing surface and the outermost peripheral portion of the substrate.

7. The apparatus according to claim 6, in which the height of the step is in the range of 0.2 to 0.5 mm.

8. The apparatus according to claim 1, in which the substrate is a planar substrate and contacts the substrate support across an entire width of the plateau.

9. The apparatus according to claim 6, in which the substrate is a planar substrate and contacts the substrate support across an entire width of the plateau.

* * * * *